United States Patent
Sadakata et al.

(10) Patent No.: US 8,078,949 B2
(45) Date of Patent: Dec. 13, 2011

(54) SEMICONDUCTOR MEMORY DEVICE

(75) Inventors: Hiroyuki Sadakata, Osaka (JP); Masahisa Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 755 days.

(21) Appl. No.: 12/212,836

(22) Filed: Sep. 18, 2008

(65) Prior Publication Data
US 2009/0094504 A1 Apr. 9, 2009

(30) Foreign Application Priority Data
Oct. 4, 2007 (JP) ................................. 2007-261222

(51) Int. Cl.
*G06F 11/00* (2006.01)
*H03M 13/00* (2006.01)

(52) U.S. Cl. ...................................... 714/801; 714/764

(58) Field of Classification Search ................... 714/801, 714/802, 800, 764, 766
See application file for complete search history.

(56) References Cited

U.S. PATENT DOCUMENTS

| | | | |
|---|---|---|---|
| 4,706,249 A | 11/1987 | Nakagawa et al. | |
| 5,195,099 A | 3/1993 | Ueda et al. | |
| 5,206,866 A | 4/1993 | Tanagawa | |
| 5,392,301 A | 2/1995 | Fukushima | |
| 6,977,858 B2 * | 12/2005 | Osada et al. | 365/222 |
| 7,032,142 B2 | 4/2006 | Fujioka et al. | |
| 7,816,950 B2 * | 10/2010 | Miyazaki | 326/93 |
| 2006/0184856 A1 * | 8/2006 | Suzuki | 714/758 |
| 2007/0226600 A1 * | 9/2007 | Ogawa | 714/798 |
| 2007/0234182 A1 * | 10/2007 | Wickeraad et al. | 714/763 |

FOREIGN PATENT DOCUMENTS

| | | |
|---|---|---|
| JP | 60-011953 | 1/1985 |
| JP | 62-001198 | 1/1987 |
| JP | 05-198200 | 8/1993 |

* cited by examiner

*Primary Examiner* — Guy Lamarre
(74) *Attorney, Agent, or Firm* — McDermott Will & Emery LLP

(57) ABSTRACT

A semiconductor memory device includes: a parity generating circuit for generating parity data corresponding to input data; a normal data latching section for latching the input data or data read out from the normal memory cell array; an input selection circuit for selectively outputting the input data or the parity data; a parity data latching section for latching and outputting the output from the input selection circuit or data read out from the parity memory cell array; and an error correction circuit for performing an error detection on the data latched by the normal data latching section by using the data latched by the parity data latching section, and performing an error correction if an error is detected, to output the obtained result. The parity data latching section outputs the data latched by itself externally of the semiconductor memory device.

15 Claims, 4 Drawing Sheets

SEMICONDUCTOR MEMORY DEVICE

CROSS REFERENCE TO RELATED APPLICATION

This application claims priority under 35 U.S.C. §119 on Patent Application No. 2007-261222 filed in Japan on Oct. 4, 2007, the entire contents of which are hereby incorporated by reference.

BACKGROUND OF THE INVENTION

The present invention relates to a semiconductor memory device with an error correction function.

In recent years, in the field of semiconductor memory devices, the circuits have been miniaturized, and the frequency of errors such as soft errors has increased accordingly. In view of this, semiconductor memory devices with an error correction function have been developed in the art.

Japanese Laid-Open Patent Publication No. 62-1198 discloses a semiconductor memory device with an error correction function. This publication states that testing a semiconductor memory device requires that it be possible to independently test memory cells and a circuit for error correction.

The publication discloses the following procedure of testing an encoder circuit and a decoder circuit for error correction in a semiconductor memory device. The process writes from outside data containing a bit error to a memory cell array, and also writes test bits capable of correcting the data to the memory cell array. Then, the data is read out from the memory cell array, with the decoder circuit activated, to examine whether the error has been corrected.

The encoder circuit can be tested as follows. Data produced by the encoder circuit is written to the memory cell array. Then, the written data is read out directly to the outside to examine whether the encoder circuit is operating as intended.

Thus, in order to test a circuit for error correction, it was necessary to first write data to memory cells and then read out the written data. Even if there is a defective memory cell in a memory cell array, a test using memory cells as described above can be performed by determining that the semiconductor memory device is defective, or by employing the redundancy repair scheme wherein the defective memory cell is replaced with a non-defective memory cell so that there are no physically-defective memory cells.

However, there are cases where a physically-defective memory cell is used as it is, and an error correction is performed on data including those from such a memory cell. Then, if there is a defective memory cell, data input from outside to the memory cell may possibly differ from the data after it is read out from the memory cell. Therefore, the encoder circuit and/or the decoder circuit may be determined defective even though they are operating normally. In other words, while a semiconductor memory device should be determined non-defective if normal data is output as a result of an error correction, it may be erroneously determined defective, thereby failing to properly perform a test.

SUMMARY OF THE INVENTION

It is an object of the present invention to provide a semiconductor memory device with an error correction function, wherein the circuit for error correction can be tested without being influenced by memory cells.

Specifically, a semiconductor memory device of the present invention includes: a parity generating circuit for generating parity data corresponding to input data; a normal memory cell array for storing the input data; a parity memory cell array for storing the parity data; a normal data latching section for latching the input data or data read out from the normal memory cell array; an input selection circuit for selectively outputting the input data or the parity data; a parity data latching section for latching and outputting the output from the input selection circuit or data read out from the parity memory cell array; and an error correction circuit for performing an error detection on the data latched by the normal data latching section by using the data latched by the parity data latching section, and performing an error correction if an error is detected, to output the obtained result. The parity data latching section outputs the data latched by itself externally of the semiconductor memory device.

Thus, it is possible to give the error correction circuit the input data and the parity data from the normal data latching section and the parity data latching section, respectively, whereby the error correction circuit can be tested, irrespective of the normal memory cell array and the parity memory cell array. Moreover, since the parity data obtained from the parity generating circuit is output from the parity data latching section, the parity generating circuit can be tested, irrespective of the parity memory cell array.

According to the present invention, it is possible to accurately test an error correction circuit and a parity generating circuit, irrespective of the presence/absence of defective memory cells. Not only is a semiconductor memory device of the present invention capable of correcting temporarily-occurring errors such as soft errors, but it also allows for the presence of physical defects in the memory cell array. Therefore, it is possible with the present invention to improve the quality and the yield of semiconductor memory devices that are designed to incorporate an error correction function.

DETAILED DESCRIPTION OF THE INVENTION

Embodiments of the present invention will now be described with reference to the drawings.

First Embodiment

Figure 1:
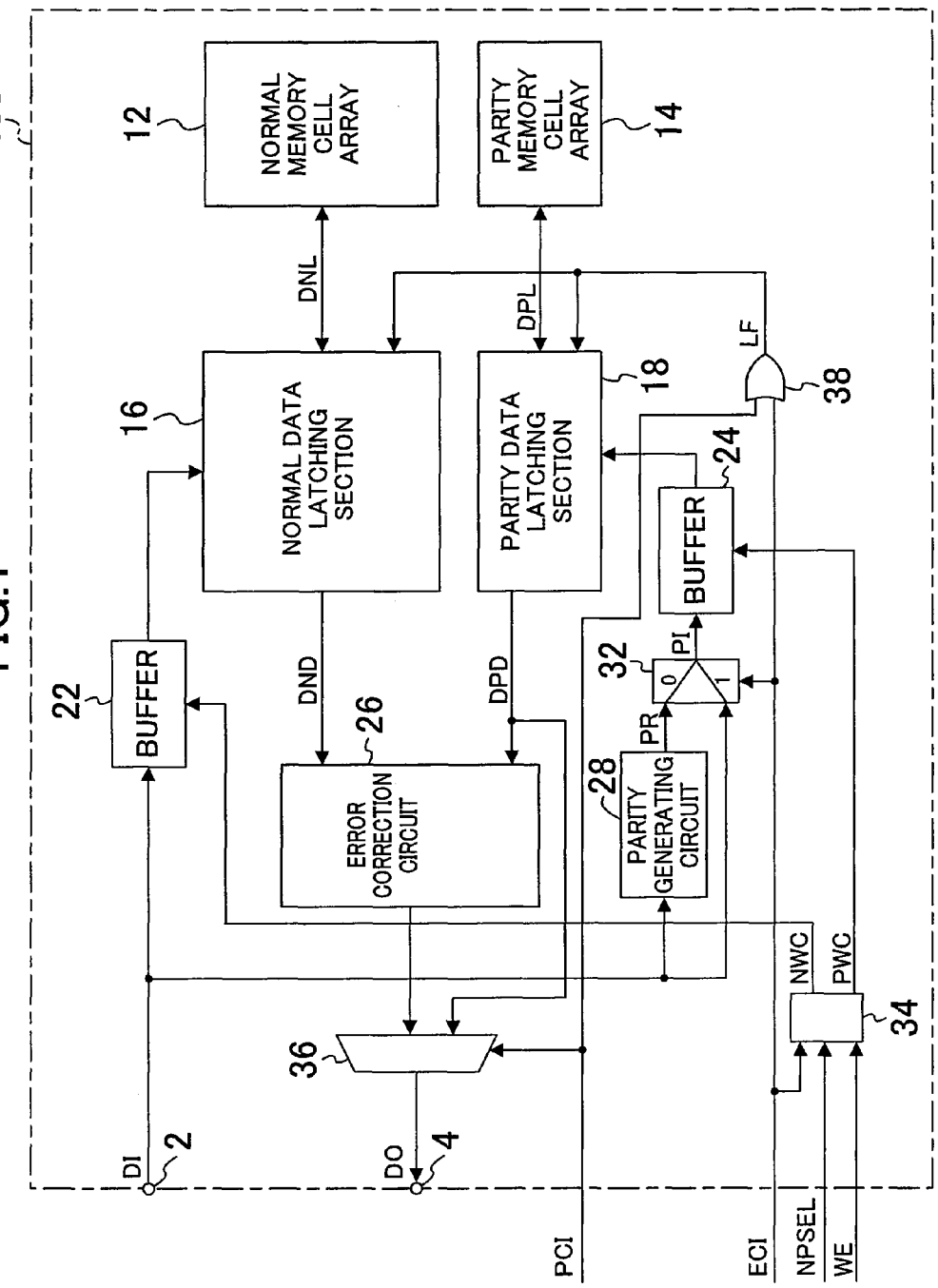
FIG. 1 is a block diagram showing a configuration of a semiconductor memory device according to a first embodiment of the present invention.

FIG. 1 is a block diagram showing a configuration of a semiconductor memory device 100 according to a first embodiment of the present invention. Referring to FIG. 1, the semiconductor memory device 100 with an error correction function includes a normal memory cell array 12, a parity memory cell array 14, a normal data latching section 16, a parity data latching section 18, write buffers 22 and 24 as write control circuits, an error correction circuit 26, a parity generating circuit 28, an input selection circuit 32, a write control circuit 34, an output selection circuit 36, and an OR gate 38. The normal memory cell array 12 and the parity memory cell array 14 each include a plurality of memory cells. The memory cells may be SRAM (static random-access memory) cells, for example. Input data DI is input to a terminal 2 from the outside of the semiconductor memory device 100 shown in FIG. 1.

Normal Operation

First, a normal operation of the semiconductor memory device 100 of FIG. 1 will be described. A write operation is performed as follows.

A write enable signal WE produced according to an external write command is input to the write control circuit 34. The write control circuit 34 enables write control signals NWC and PWC. The parity generating circuit 28 generates and outputs parity data PR corresponding to the input data DI.

The write buffer 22 for normal data outputs the input data DI to the normal data latching section 16. The input selection circuit 32 selects the parity data PR from the parity generating circuit 28 and outputs the parity data PR to a write buffer 24 for parity data. The write buffer 24 outputs an output PI of the input selection circuit 32 to the parity data latching section 18.

The normal data latching section 16 temporarily latches the input data DI. The parity data latching section 18 latches the output PI of the input selection circuit 32 (parity data). The normal data latching section 16 and the parity data latching section 18 write the latched data to the normal memory cell array 12 and the parity memory cell array 14, respectively. The write operation is thus completed.

A read operation is performed as follows. The normal data latching section 16 and the parity data latching section 18 reads out and latches data from the normal memory cell array 12 and the parity memory cell array 14, respectively, according to an external read command, and outputs the data to the error correction circuit 26.

The error correction circuit 26 performs error detection on the data latched by the normal data latching section 16 by using the data latched by the parity data latching section 18. If an error is detected, the error correction circuit 26 performs an error correction on the data latched by the normal data latching section 16 by using the data latched by the parity data latching section 18 to output the corrected data to the output selection circuit 36. The output selection circuit 36 selects the output of the error correction circuit 26 and outputs it as output data DO according to a parity circuit test signal PCI. The output data DO is output to the outside of the semiconductor memory device 100 shown in FIG. 1 via a terminal 4. The read operation is thus completed.

Figure 2:
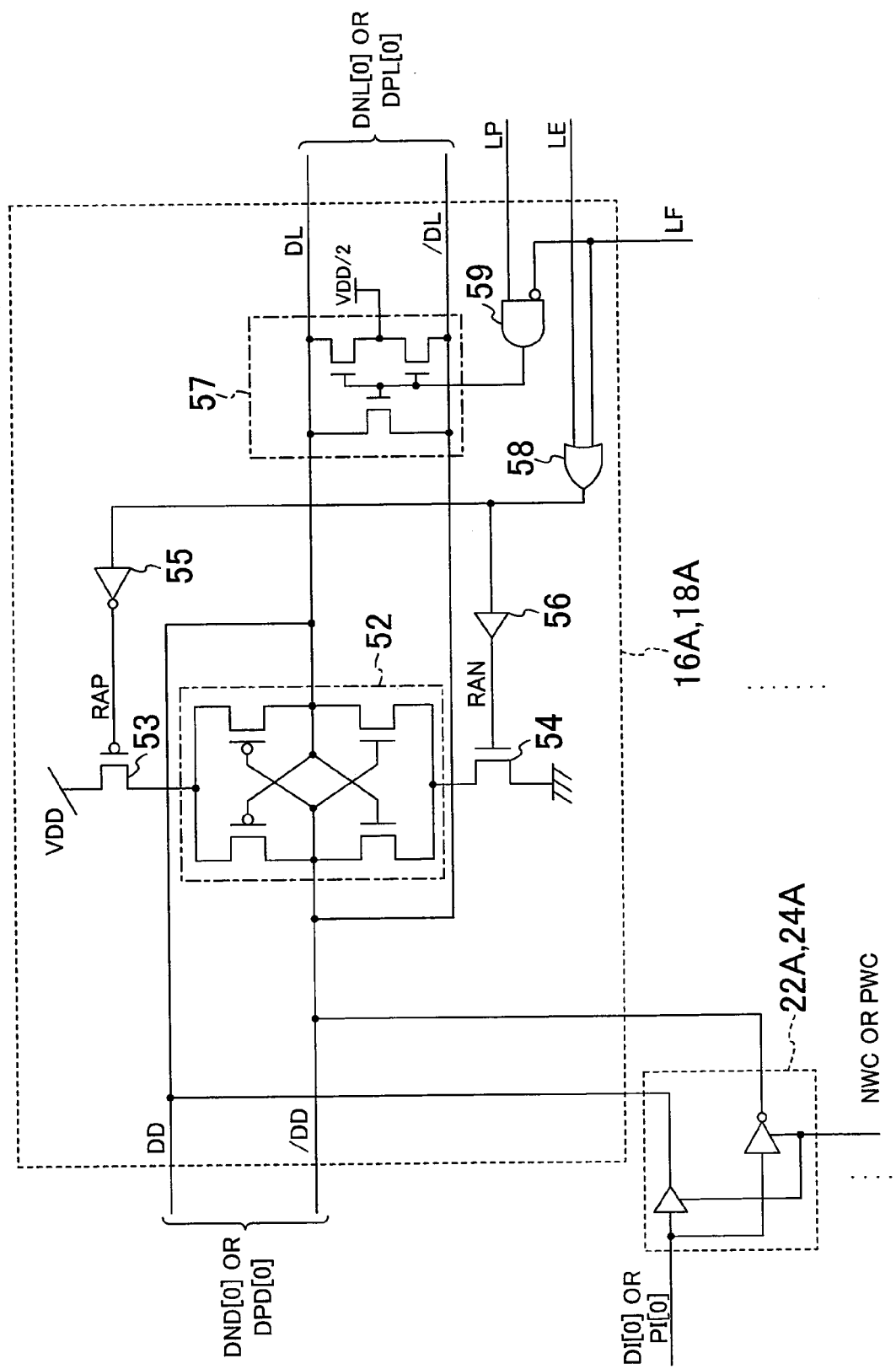
FIG. 2 is a circuit diagram showing a configuration of a normal data latching section and a write buffer of FIG. 1.

FIG. 2 is a circuit diagram showing a configuration of the normal data latching section 16 and the write buffer 22 of FIG. 1. The normal data latching section 16 includes a data latch circuit 16A, which includes an amplifier 52, a PMOS transistor 53, an NMOS transistor 54, an inverter 55, a buffer 56, a precharge circuit 57, and gates 58 and 59.

The normal data latching section 16 includes n circuits (n is an integer of 2 or more) having the same configuration as the data latch circuit 16A. The write buffer 22 includes n circuits having the same configuration as a buffer 22A. Only the data latch circuit 16A and the buffer 22A, processing one bit of the input/output data of the normal data latching section 16 and the write buffer 22, will be described below. Note that the other circuits having the same configurations as the data latch circuit 16A and the buffer 22A operate in the same manner, except that each circuit processes a corresponding bit.

First, during a non-operation period (i.e., a stand-by state), a data latch enable signal LE and a data latch signal LF are at the low potential "L", the signal RAP is at the high potential "H", and the signal RAN is at "L". Since the PMOS transistor 53 and the NMOS transistor 54 are off, the amplifier 52 is not operative. Since a precharge signal LP is enabled ("H"), the transistors of the precharge circuit 57 are all on. Bit lines DL and /DL carrying data DNL [0] to/from the normal memory cell array 12 are precharged to a potential VDD/2.

During a write operation, the data latch circuit 16A operates as follows. First, the precharge signal LP is disabled ("L"), and the precharge circuit 57 stops. As the data latch enable signal LE goes "H", a signal RAP goes "L" and a signal RAN goes "H", the amplifier 52 operates as an amplifier and latch circuit.

Then, the write control circuit 34 enables the write control signal NWC according to the write enable signal WE, whereby the buffer 22A outputs the input data DI [0] to the data latch circuit 16A, and the amplifier 52 latches the input data DI [0] from outside. The latched data is written to the normal memory cell array 12. Herein, it is necessary that the driving capability of the buffer 22A is higher than that of the amplifier 52.

Once the write operation to the memory cell array 12 is completed, the data latch enable signal LE is disabled ("L") and the precharge signal LP is enabled ("H"). The precharge circuit 57 again precharges the bit lines DL and /DL.

During a read operation, the data latch circuit 16A operates as follows. First, the precharge signal LP is disabled ("L") according to a read command. Then, data from a memory cell is propagated to the bit lines DL and /DL. After data is sufficiently propagated, the data latch enable signal LE is enabled ("H"), whereby the amplifier 52 operates as a read amplifier and latch circuit, and the data read out from the memory cell is output to the error correction circuit 26 as data DND [0] (a signal DD or a differential signal represented by signals DD and /DD).

After the completion of the read operation, the data latch enable signal LE is disabled ("L"), and the precharge signal LP is enabled ("H"). The precharge circuit 57 again precharges the bit lines DL and /DL.

Thus, the normal data latching section 16 is capable of a two-way latching operation, i.e., both latching the write data and latching the read data.

The parity data latching section 18 includes m circuits (m is an integer of 2 or more) having the same configuration as the data latch circuit 16A. A data latch circuit 18A is included in the m circuits. The write buffer 24 includes m circuits having the same configuration as the buffer 22A. A buffer 24A is included in the m circuits.

The parity data latching section 18 is similar to the normal data latching section 16, except that the parity data latching section 18 handles data DPL and DPD and the output of the write buffer 24, instead of the data DNL and DND and the output of the write buffer 22. Moreover, the write buffer 24 is similar to the write buffer 22, except that the write buffer 24 handles the output PI and the write control signal PWC of the input selection circuit 32, instead of the input data DI and the write control signal NWC. Thus, the parity data latching section 18 and the write buffer 24 will not be further described below.

Error Correction Circuit Test

The semiconductor memory device 100 of FIG. 1 is set to the error correction circuit test mode when an error correction circuit test signal ECI is enabled ("H"). Since the data latch signal LF goes "H", the precharge circuit 57 is not operative and the amplifier 52 is operative, whereby the normal data latching section 16 and the parity data latching section 18 constantly latch data as latch circuits. Then, the input selection circuit 32 selects and outputs the input data DI from outside. Moreover, a normal/parity write selection signal NPSEL indicates that the normal data latching section 16 should be selected in order to write the input data DI to the normal data latching section 16.

Then, a write operation is performed according to an external write command. According to the logical values of the write enable signal WE, the error correction circuit test signal ECI and the normal/parity write control signal NPSEL, the write control circuit 34 enables only the write control signal NWC, thus activating the write buffer 22. As a result of this operation, the input data DI is written only to the normal data latching section 16.

Then, the normal/parity write selection signal NPSEL indicates that the parity data latching section 18 should be selected in order to write to the parity data latching section 18. Then, a write operation is performed according to an external write command. According to the logical values of the write enable signal WE, the error correction circuit test signal ECI and the normal/parity write control signal NPSEL, the write control circuit 34 enables only the write control signal PWC, thus activating the write buffer 24. As a result of this operation, the input data DI is written only to the parity data latching section 18.

Thus, any external data can be written to the normal data latching section 16 and the parity data latching section 18. Similar data is written also to the normal memory cell array 12 and the parity memory cell array 14.

Then, an external read command is received. The normal data latching section 16 and the parity data latching section 18 need to be precharged during a normal operation in a period when data is read out from the memory cell so as to be able to latch the data from the memory cells. During an error correction circuit test, however, the normal data latching section 16 and the parity data latching section 18 constantly operate as latch circuits. Thus, the normal data latching section 16 and the parity data latching section 18 are holding the most recently latched data, irrespective of the data read out from the memory cells. Thus, the normal data latching section 16 and the parity data latching section 18 are holding the input data DI received in the write operation thereto.

The data held by the normal data latching section 16 and the parity data latching section 18 are output as the data DND and DPD to the error correction circuit 26. The error correction circuit 26 performs an error detection based on the data DND and DPD, and further performs an error correction if an error is detected, to output the obtained result to the output selection circuit 36. The output selection circuit 36 selects and outputs the output of the error correction circuit 26.

The expected value of the output of the error correction circuit 26 is known based on the input data to the normal data latching section 16 and the input data to the parity data latching section 18. Thus, by comparing the value actually output from the error correction circuit 26 with the expected value, it is possible to test the error correction circuit itself, irrespective of the presence/absence of defective memory cells.

Either the write operation to the normal data latching section 16 or the write operation to the parity data latching section 18 may be performed before the other.

Parity Generating Circuit Test

The semiconductor memory device 100 of FIG. 1 is set to the parity circuit test mode when the parity circuit test signal PCI is enabled ("H"). Since the data latch signal LF goes "H", the precharge circuit 57 is not operative and the amplifier 52 is operative, whereby the normal data latching section 16 and the parity data latching section 18 constantly latch data as latch circuits. Then, the input selection circuit 32 selects and outputs the parity data PR output from the parity generating circuit 28.

Then, a write operation is performed according to an external write command. According to the logical values of the write enable signal WE, the error correction circuit test signal ECI and the normal/parity write control signal NPSEL, the write control circuit 34 enables the write control signal PWC, thus activating the write buffer 24. As a result of this operation, the parity data PR is written to the parity data latching section 18. Similar data is written also to the parity memory cell array 14. Herein, since data of the normal data latching section 16 is not used, the write buffer 22 may be either active/inactive.

Then, an external read command is received. Also during a parity generating circuit test, the parity data latching section 18 constantly operates as a latch circuit as described above. Thus, the parity data latching section 18 is holding the most recently latched data, irrespective of the data read out from the memory cell. Thus, the parity data latching section 18 is holding the parity data PR.

Data held in the parity data latching section 18 is output to the output selection circuit 36 as the data DPD. According to the parity circuit test signal PCI, the output selection circuit 36 selects the output data DPD of the parity data latching section 18, and outputs it as the output data DO. The output data DO is output to the outside of the semiconductor memory device 100 shown in FIG. 1 via the terminal 4. In summary, as illustrated in FIG. 1, the parity data latching section 18 outputs the latched data DPD externally of the semiconductor memory device 100 via the terminal 4.

The expected value of the parity data is known based on the input data to the parity data latching section 18. Thus, by comparing the parity data actually generated by the parity generating circuit 28 and output via the parity data latching section 18 with the expected value, it is possible to test the parity generating circuit itself, irrespective of the presence/absence of defective memory cells.

Second Embodiment

Figure 3:
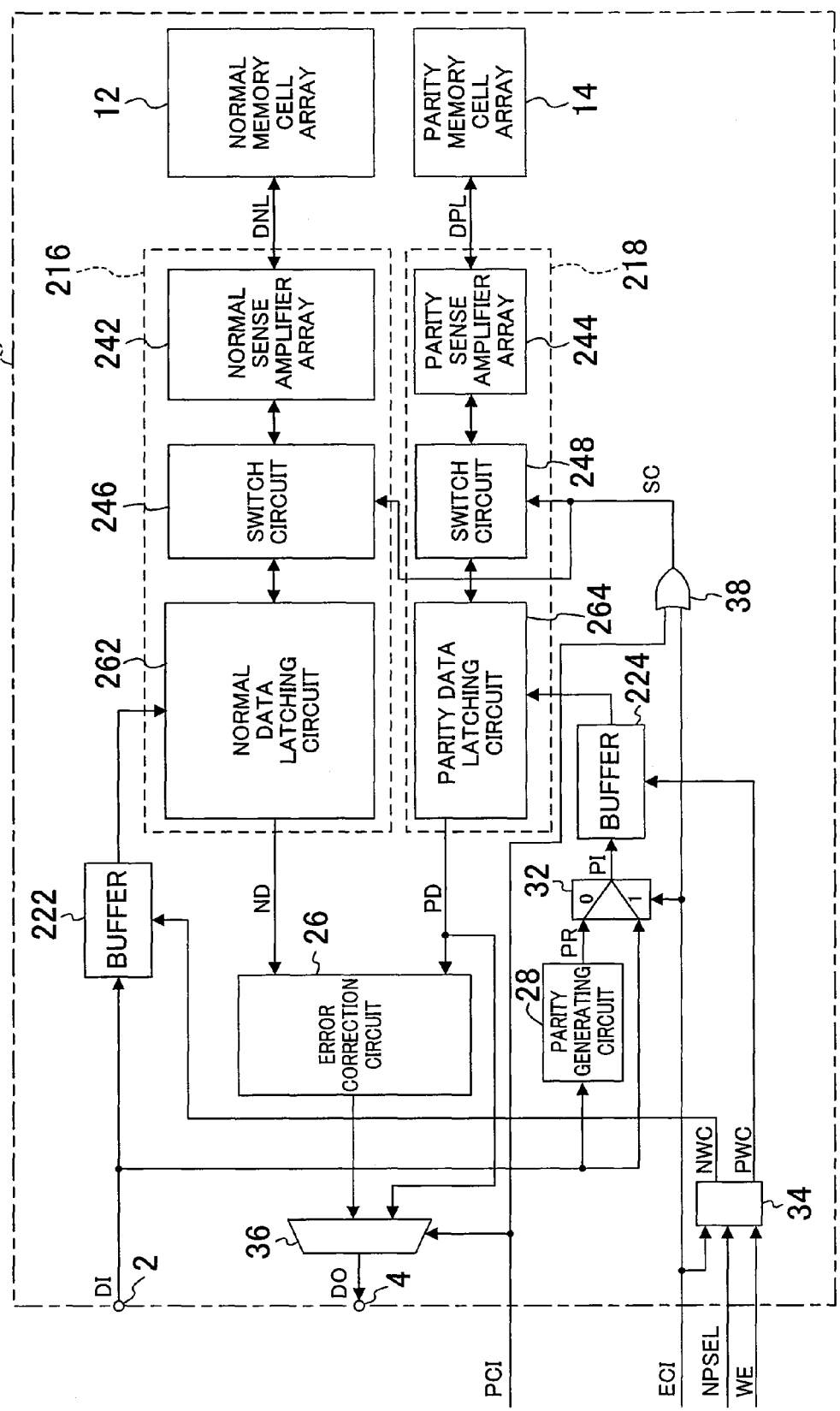
FIG. 3 is a block diagram showing a configuration of a semiconductor memory device according to a second embodiment of the present invention.

FIG. 3 is a block diagram showing a configuration of a semiconductor memory device 200 according to a second embodiment of the present invention. The semiconductor memory device 200 of FIG. 3 is similar to that of FIG. 1, except that it includes a normal data latching section 216, a parity data latching section 218 and write buffers 222 and 224 as write control circuits, instead of the normal data latching section 16, the parity data latching section 18 and the write buffers 22 and 24. The normal data latching section 216 includes a normal sense amplifier array 242, a switch circuit 246, and a normal data latching circuit 262. The parity data latching section 218 includes a parity sense amplifier array 244, a switch circuit 248, and a parity data latching circuit 264.

Figure 4:
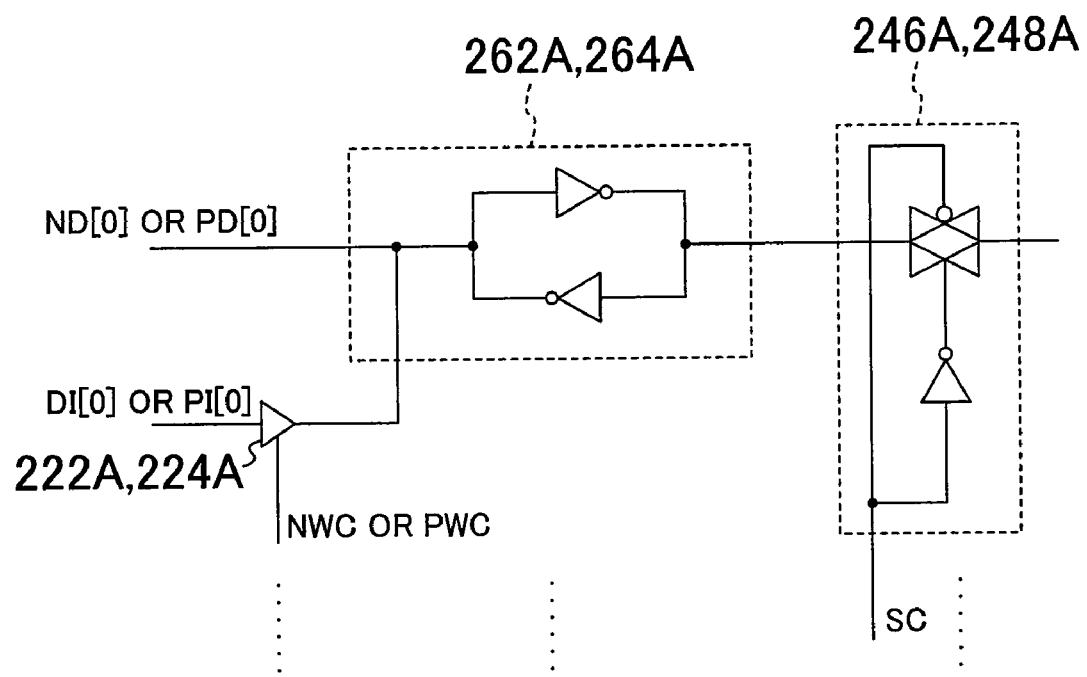
FIG. 4 is a circuit diagram showing a configuration of a switch circuit, a normal data latching circuit and a write buffer of FIG. 3.

FIG. 4 is a circuit diagram showing a configuration of the switch circuit 246, the normal data latching circuit 262 and the write buffer 222 of FIG. 3. The normal data latching circuit 262 includes a data latch circuit 262A, and the data latch circuit 262A includes two inverters each having its input connected to the output of the other.

The normal data latching circuit 262 includes n circuits having the same configuration as the data latch circuit 262A. The write buffer 222 includes n circuits having the same configuration as a buffer 222A. The switch circuit 246 includes n circuits having the same configuration as a switch 246A.

As an example, the data latch circuit 262A, the buffer 222A and the switch 246A for processing one bit of the input/output data of the normal data latching circuit 262, the write buffer 222 and the switch circuit 246 will be described. Note that the other circuits having the same configurations as the data latch circuit 262A, the buffer 222A and the switch 246A operate in the same manner, except that each circuit processes a corresponding bit.

The parity data latching circuit 264 includes m circuits having the same configuration as the data latch circuit 262A. A data latch circuit 264A is included in the m circuits. The write buffer 224 includes m circuits having the same configuration as the buffer 222A. A buffer 224A is included in the m circuits. The switch circuit 248 includes m circuits having the same configuration as the switch 246A.

The parity data latching circuit 264, the write buffer 224 and the switch circuit 248 are similar operate in the same manner as the normal data latching circuit 262, the write buffer 222 and the switch circuit 246, except that they handle corresponding data.

Normal Operation

During a normal operation, since a switch control signal SC output from the OR gate 38 (the same as the data latch signal LF of FIG. 1) is "L", the switch 246A, etc., of the switch circuits 246 and 248 are always on. Thus, the electrical connection between the normal sense amplifier array 242 and the normal data latching circuit 262, and that between the parity sense amplifier array 244 and the parity data latching circuit 264 are both established.

During a read operation, the normal sense amplifier array 242 and the parity sense amplifier array 244 amplify data read out from the normal memory cell array 12 and the parity memory cell array 14 to output the results to the switch circuits 246 and 248, respectively. The data latch circuits 262A and 264A, etc., each operate as a read amplifier and latch circuit. Other operations during the write operation and the read operation are as described above in the first embodiment.

Since the data latch circuits 262A and 264A, etc., do not need to amplify the read-out data, they may be simple inverter latch circuits as shown in FIG. 4. However, it is necessary that the driving capability of the sense amplifiers included in the normal sense amplifier array 242 and the parity sense amplifier array 244 is greater than those of the data latch circuits 262A and 264A, etc. In other words, it is necessary that data of the data latch circuits 262A and 264A, etc., can be inverted by the sense amplifiers.

Error Correction Circuit Test And Parity Generating Circuit Test

During the test of the error correction circuit 26 and the test of the parity generating circuit 28, the switch control signal SC is "H", and the switch circuits 246 and 248 are therefore off. Thus, the electrical connection between the normal sense amplifier array 242 and the normal data latching circuit 262, and that between the parity sense amplifier array 244 and the parity data latching circuit 264 are not established, electrically separating these elements from each other. Therefore, data of the normal data latching circuit 262 and the parity data latching circuit 264 will not be overwritten by the sense amplifier output. Thus, by writing data to the normal data latching section 216 and the parity data latching section 218, as with the semiconductor memory device 100 of FIG. 1, it is possible to test the error correction circuit 26 and the parity generating circuit 28, irrespective of the presence/absence of defective memory cells. In summary, as illustrated in FIG. 3, the parity data latching circuit 264 outputs the latched data PD externally of the semiconductor memory device 200 via the terminal 4.

It is not necessary that the switch circuits 246 and 248 are always off during the error correction circuit test and the parity generating circuit test. Specifically, during a write operation, the switch circuits 246 and 248 may be on, in which case data is written to the sense amplifiers 242 and 244 and the memory cell arrays 12 and 14. Only during a read operation, it is necessary that the switch circuits 246 and 248 are off. Thus, it is possible to prevent erroneous data from a defective memory cell from being transferred to the normal data latching circuit 262 and the parity data latching circuit 264, whereby it is possible to realize an accurate test of the error correction circuit 26 and the parity generating circuit 28.

In the semiconductor memory device 100 of FIG. 1, the driving capability of the data latch circuit 16A, or the like, is normally sufficiently greater than that obtained from data read out from a memory cell, whereby the data latch circuit can continue to hold data, irrespective of the data of a memory cell. Therefore, it is not necessary to provide a switch for separating a memory cell and the data latch circuit 16A from each other. However, the data latch circuit is required to have a precharge function.

With the semiconductor memory device 200 of FIG. 3, the driving capability of the data latch circuit 262A, or the like, is small, whereby data of the data latch circuit 262A, or the like, may be inverted by the sense amplifier output or by data read out from a memory cell. Therefore, the switch circuits 246 and 248 are provided for electrically separating the memory cell array or the sense amplifiers and the data latch circuit 262A, etc., from each other. Thus, data of the data latch circuit is prevented from being destroyed by the output data of the memory cell array or the sense amplifiers.

As described above, the present invention can test an error correction circuit, etc., irrespective of defects in the memory cell array, and is therefore useful as a semiconductor memory device with an error correction function.

What is claimed is:

1. A semiconductor memory device, comprising:
a parity generating circuit for generating parity data corresponding to input data;
a normal memory cell array for storing the input data;
a parity memory cell array for storing the parity data;
a normal data latching section for latching the input data or data read out from the normal memory cell array;
an input selection circuit for selectively outputting the input data or the parity data;
a parity data latching section for latching and outputting the output from the input selection circuit or data read out from the parity memory cell array; and
an error correction circuit for performing an error detection on the data latched by the normal data latching section by using the data latched by the parity data latching section, and performing an error correction if an error is detected, to output the obtained result,
wherein the parity data latching section outputs the data latched by the parity data latching section externally of the semiconductor memory device.

2. The semiconductor memory device of claim 1, wherein it is possible to control whether the normal data latching section and the parity data latching section perform a latch operation, and the normal data latching section and the parity data latching section continuously perform the latch operation according to a control signal.

3. The semiconductor memory device of claim 1, further comprising a write control circuit for controlling whether the input data is output to the normal data latching section,
wherein the normal data latching section receives the input data via the write control circuit.

4. The semiconductor memory device of claim 1, further comprising a write control circuit for controlling whether the output from the input selection circuit is output to the parity data latching section,
   wherein the parity data latching section receives the output from the input selection circuit via the write control circuit.

5. The semiconductor memory device of claim 1, further comprising:
   a first write control circuit for controlling whether the input data is output to the normal data latching section; and
   a second write control circuit for controlling whether the output from the input selection circuit is output to the parity data latching section, wherein:
   the normal data latching section receives the input data via the first write control circuit; and
   the parity data latching section receives the output from the input selection circuit via the second write control circuit.

6. The semiconductor memory device of claim 5, wherein the first and second write control circuits each control whether the output is made during a period in which the normal data latching section and the parity data latching section perform a latch operation.

7. The semiconductor memory device of claim 1, further comprising a circuit capable of electrically separating the normal memory cell array and the normal data latching section from each other and the parity memory cell array and the parity data latching section from each other.

8. The semiconductor memory device of claim 1, wherein:
   the normal data latching section includes:
      a normal data latching circuit for performing a latch operation; and
      a normal sense amplifier array for amplifying data read out from the normal memory cell array; and
   the parity data latching section includes:
      a parity data latching circuit for performing a latch operation; and
      a parity sense amplifier array for amplifying data read out from the parity memory cell array.

9. The semiconductor memory device of claim 8, wherein:
   the normal data latching section further includes a first switch circuit capable of electrically separating the normal sense amplifier array and the normal data latching circuit from each other; and
   the parity data latching section further includes a second switch circuit capable of electrically separating the parity sense amplifier array and the parity data latching circuit from each other.

10. The semiconductor memory device of claim 9, wherein the normal data latching circuit and the parity data latching circuit also have a function as a read amplifier.

11. The semiconductor memory device of claim 9, wherein the first and second switch circuits are on during a normal operation, and off during a test of the error correction circuit and a test of the parity generating circuit.

12. The semiconductor memory device of claim 1, wherein a terminal via which data output from the error correction circuit is output externally of the semiconductor memory device serves also as a terminal via which data latched by the parity data latching section is output externally of the semiconductor memory device.

13. The semiconductor memory device of claim 12, further comprising an output selection circuit for selectively outputting the output from the error correction circuit or the data latched by the parity data latching section.

14. The semiconductor memory device of claim 1, wherein a terminal via which input data is input to the normal data latching section serves also as a terminal via which input data is input to the input selection circuit.

15. The semiconductor memory device of claim 1, wherein the normal memory cell array and the parity memory cell array each include a plurality of SRAM (static random-access memory) cells.

* * * * *